United States Patent
Seko

(10) Patent No.: US 7,199,662 B2
(45) Date of Patent: Apr. 3, 2007

(54) BIAS CIRCUIT FOR A DISPLAY DRIVER OPERATIONAL AMPLIFIER

(75) Inventor: Yoshikazu Seko, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 69 days.

(21) Appl. No.: 11/007,234

(22) Filed: Dec. 9, 2004

(65) Prior Publication Data

US 2005/0128002 A1    Jun. 16, 2005

(30) Foreign Application Priority Data

Dec. 12, 2003    (JP)    ............................. 2003-414143

(51) Int. Cl.
*H03F 3/45*    (2006.01)
(52) U.S. Cl. ..................................... 330/261
(58) Field of Classification Search ................ 330/261; 345/204
See application file for complete search history.

(56) References Cited

U.S. PATENT DOCUMENTS 6,717,468 B1 *    4/2004    Jeong et al. ................. 330/253

FOREIGN PATENT DOCUMENTS

| JP | 9-93055 | 4/1997 |
| JP | 2003-66919 | 3/2003 |

* cited by examiner

*Primary Examiner*—Steven J. Mottola
(74) *Attorney, Agent, or Firm*—McGinn IP Law Group, PLLC

(57) ABSTRACT

Output circuit in which electric current consumption of operational amplifiers therein is reduced and distortion of the output waveforms of the operational amplifiers is also reduced. A bias circuit 30 is constituted from a bias current source 31, a bias voltage extracting circuit 22, a precharge circuit 34, and a precharge power supply 35. When a timing signal Tp of a predetermined pulse width is supplied to the bias circuit 30, MOS transistors 28 and 29 in the precharge circuit 34 are turned on during the period of its pulse width, and desired precharge voltages Vpn and Vpp are charged to capacitors Cn and Cp from the precharge power supply 35. The voltages charged to the capacitors Cn and Cp are supplied to operational amplifiers through an N-bias line 11 and a P-bias line 12 as bias voltages VbiasA and VbiasB, respectively, so that the operational amplifiers are controlled to be biased at high biases. The bias voltages VbiasA and VbiasB after precharging transition from high to low according to CR time constant curves for the discharge paths of the capacitors Cn and Cp. This transition period can be set by adjusting the precharge voltages using the variable precharge power supply 35.

14 Claims, 7 Drawing Sheets

FIG. 12　　　　　　　　　　　　　　　　PRIOR ART
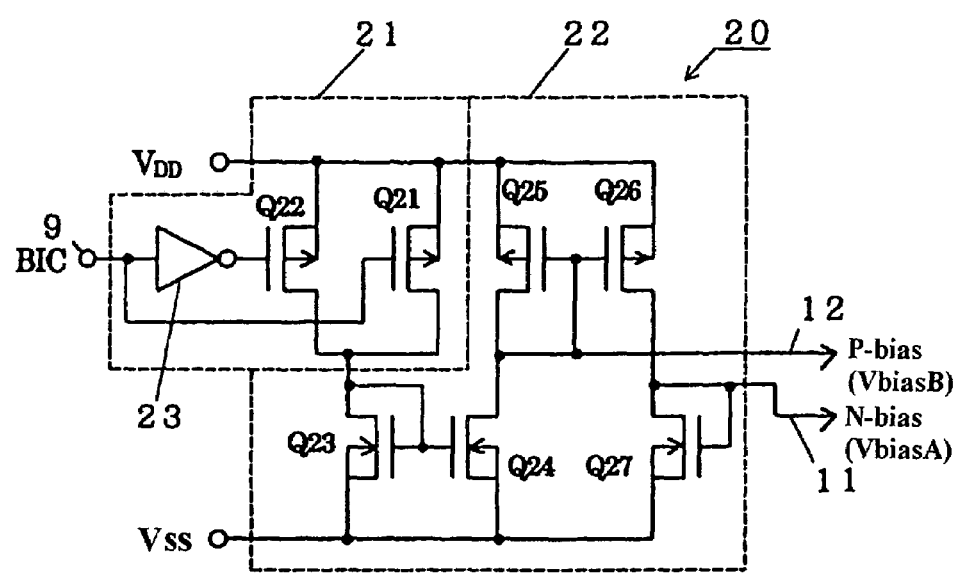

BIAS CIRCUIT FOR A DISPLAY DRIVER OPERATIONAL AMPLIFIER

FIELD OF THE INVENTION

The present invention relates to an output circuit. More specifically, the invention relates to an output circuit including operational amplifiers and a bias circuit for controlling the bias currents of the operational amplifiers so as to improve slew rates at the time of rise and fall of the output signals of the operational amplifiers.

BACKGROUND OF THE INVENTION

As a dot matrix type display device, liquid crystal display devices are employed for various devices such as a personal computer, because of its advantages of thinness, light weight, and low power consumption. Among them, color liquid crystal devices with an active matrix system which are particularly advantageous for controlling image quality with high definition, have become mainstream. In the liquid crystal display device of this type, an output circuit provided with operational amplifiers of a voltage follower connection and a bias circuit for controlling the bias currents of the operational amplifiers is employed as the output circuit of a data side driving circuit formed of a semiconductor integrated circuit device, for driving a data line of a liquid crystal panel (LCD panel) that is a capacitive load.

An output circuit 101 shown in FIG. 7 is an output circuit of a two-amplifier system, and includes a plurality of push output type operational amplifiers 1 (of which only one is shown) for outputting rising waveforms and a plurality of pull output type operational amplifiers 2 (of which only one is shown) for outputting falling waveforms, as the operational amplifiers. A circuit example of an operational amplifier 1 is illustrated in FIG. 8, and a circuit example of an operational amplifier 2 is illustrated in FIG. 9 (refer to Patent Document 1, for example). The operational amplifier 1 has a terminal 3 for supplying (N-biasing) a bias voltage VbiasA to internal N-channel MOS transistors Q5 and Q7. The operational amplifier 2 includes a terminal 4 for supplying (P-biasing) a bias voltage VbiasB to internal P-channel MOS transistors Q15 and Q17. Further, a bias circuit 10 is provided as the bias circuit. From the bias circuit 10, the bias voltage VbiasA is supplied to the terminal 3 of the operational amplifier 1 through an N-bias line 11, and the bias voltage VbiasB is supplied to the terminal 4 of the operational amplifier 2 through a P-bias line 12.

An output circuit 102 shown in FIG. 10 is the output circuit of a one-amplifier system, and includes a plurality of push-pull output type operational amplifiers 5 (of which two are shown) each for outputting both rising and falling waveforms, as the operational amplifiers. A circuit example of an operational amplifier 5 is illustrated in FIG. 11 (refer to Patent Document 2, for example). The operational amplifier 5 includes a terminal 6 for supplying the bias voltage VbiasA to the internal N-channel MOS transistor Q5 and a terminal 7 for supplying the bias voltage VbiasB to the internal P-channel MOS transistor Q15 and the like. Further, as the bias circuit, a bias circuit 10 is provided, as in FIG. 7. From the bias circuit 10, the bias voltage VbiasA is supplied to the terminal 6 of the operational amplifier 5 through the N-bias line 11 and the bias voltage VbiasB is supplied to the terminal 7 of the operational amplifier 5 through the P-bias line 12.

Referring to the output circuits 101 and 102 described above, the ones provided with the bias circuit for controlling the bias currents of the operational amplifiers 1, 2, and 5 so as to improve the slew rates at the times of rise of the output signals of the operational amplifiers 1 and 5 and falls of the output signals of the operational amplifiers 2 and 5 as the bias circuit 10 are employed (refer to Patent Document 1, for example). A conventional bias circuit 20 will be described below with reference to FIG. 12. [Note, reference is made to JP-A-2003-66919, paragraph [0006] and its FIG. 10 which correspond to the FIG. 12 of the instant invention.] The bias circuit 20 includes a bias current source 21 and a bias voltage extracting circuit 22. The bias current source 21 includes an inverter 23 and P-channel MOS transistors Q21 and Q22 for the bias current source that are connected in parallel and have mutually different ON-resistances R1 and R2 (not shown), respectively, in which R1 is larger than R2. Sources of the MOS transistors Q21 and Q22 are connected to a high-voltage side terminal VDD, and drains of the MOS transistors Q21 and Q22 are connected to the bias voltage extracting circuit 22. The gate of the MOS transistor Q22 is connected in common to the gate of the MOS transistor Q21 via the inverter 23 and is connected to a bias switching terminal 9.

The bias voltage extracting circuit 22 includes N-channel MOS transistors Q23, Q24, and Q27 and P-channel MOS transistors Q25 and Q26. The N-channel MOS transistor Q23 is connected between the bias current source 21 and a low-voltage side terminal VSS. The N-channel MOS transistor Q24 is mirror connected to the MOS transistor Q23. The P-channel MOS transistor Q25 is connected in series with the MOS transistor Q24 between the high-voltage side terminal VDD and the low-voltage side terminal VSS. The P-channel MOS transistor Q26 is mirror-connection with to the MOS transistor Q25. The N-channel MOS transistor Q27 is connected in series with the MOS transistor Q26 between the high-voltage side terminal VDD and the low-voltage side terminal VSS. The drain of the MOS transistor Q23 is connected to the drains of the MOS transistors Q21 and Q22. The source of the MOS transistor Q23 is connected to the low-voltage side terminal VSS, and the MOS transistor Q23 has the drain thereof and the gate thereof short-circuited for a diode connection. The drain of the MOS transistor Q24 is connected to the drain of the MOS transistor Q25, the source of the MOS transistor Q24 is connected to the low-voltage side terminal VSS, and the gate of the MOS transistor Q24 is connected to the gate of the MOS transistor Q23. The source of the MOS transistor Q25 is connected to the high-voltage side terminal VDD, and the MOS transistor Q25 has the drain thereof and the gate thereof short-circuited for the diode connection. The source of the MOS transistor Q26 is connected to the high-voltage side terminal VDD, the drain of the MOS transistor Q26 is connected to the drain of the MOS transistor Q27, and the gate of the MOS transistor Q26 is connected to the gate of the MOS transistor Q25. The source of the MOS transistor Q27 is connected to the low-voltage side terminal VSS, and the MOS transistor Q27 has the drain thereof and the gate thereof short-circuited for the diode connection. Then, the series connection node between the MOS transistor Q26 and the MOS transistor Q27 is connected to the N-bias line 11 as the output terminal of the bias voltage VbiasA, and the series connection node between the MOS transistor Q24 and the MOS transistor Q25 is connected to the P-bias line 12 as the output terminal of the bias voltage VbiasB.

Next, an operation of the above-mentioned bias circuit 20 will be described. When a bias switching signal BIC at an "L (low) level" is supplied to the bias switching terminal 9, the MOS transistor Q21 is turned on. Then, the resistance of the bias current source 21 becomes the ON-resistance R1 of the MOS transistor Q21 (which is larger than R2 of Q22). Thus, a current corresponding to the ON-resistance R1 and smaller than that in a case associated with the ON-resistance R2 flows through the bias current source 21. Then, from the bias voltage extracting circuit 22, a bias voltage (being closer to VDD) smaller than that in the case associated with the ON-resistance R2 is supplied to the P-bias line 12, and a bias voltage (being closer to VSS) smaller than that in the case associated with the ON-resistance R2 is supplied to the N-bias line 11. When the bias switching signal BIC at a "H (high) level" is supplied to the bias switching terminal 9, the MOS transistor Q22 is turned ON, so that the resistance of the bias current source 21 becomes the ON-resistance R2 of the MOS transistor Q22 (which is smaller than R1). Thus, a current corresponding to the ON-resistance R2 and is larger than that in a case associated with the ON-resistance R1 flows through the bias current source 21. Then, from the bias voltage extracting circuit 22, a bias voltage larger (being farther from VDD) than that in the case associated with the ON-resistance R1 is supplied to the P-bias line 12, and a bias voltage (being farther from VSS) larger than that in the case associated with the ON-resistance R1 is supplied to the N-bias line 11.

The bias currents of the operational amplifiers 1, 2, and 5 are controlled by the bias circuit 20 as follows, thereby improving the slew rates at the times of rise of the output signals from the operational amplifiers 1 and 5 and fall of the output signals from the operational amplifiers 2 and 5. That is, at the times of the rise of the output signals from the operational amplifiers 1 and 5 and the fall of the output signals from the operational amplifiers 2 and 5, the bias switching signal BIC at the "H (high) level" is supplied to the bias switching terminal 9. The bias currents of the operational amplifiers 1, 2, and 5 are thereby set to be high by the bias circuit 20, so that the slopes of the rising waveforms of the output signals of the operational amplifiers 1 and 5 and the slopes of the falling waveforms of the output signals of the operational amplifiers 2 and 5 become sharp. During predetermined periods before and after the rise of the output signals of the operational amplifiers 1 and 5 and the fall of the output signals of the operational amplifiers 2 and 5, the bias switching signal BIC at the "L (low) level" is supplied to the bias switching terminal 9. The bias currents of the operational amplifiers 1, 2, and 5 are thereby set to be low by the bias circuit 20. Thus, during the periods, electric current consumption of the operational amplifiers 1, 2, and 5 is reduced.

[Patent Document 1] JP Patent Kokai JP-A-2003-66919
[Patent Document 2] JP Patent Kokai JP-A-9-93055

The entire disclosure of these documents are incorporated herein by reference thereto.

SUMMARY OF THE DISCLOSURE

By the way, in the output circuits 101 and 102 described above, control over the bias currents of the operational amplifiers 1, 2, and 5 is performed by switching of the MOS transistors Q21 and Q22 in the bias circuit 20 having different transistor sizes. Thus, the control becomes a step control. As a result, during the bias current control at the times of the rise of the output signals of the operational amplifiers 1 and 5 and the fall of the output signals of the operational amplifiers 2 and 5, the biases are set at the same high levels during a certain period of time. For this reason, there is a problem that fine control for low electric current consumption cannot be performed. Further, because of setting of the biases at the same high levels for the certain period of time, there is another problem that waveform distortion such as overshooting or undershooting of the outputs is apt to be generated.

An object of the present invention is therefore to provide an output circuit in which electric current consumption of operational amplifiers therein is reduced and distortion of the output waveforms of the operational amplifiers is also reduced.

(1) According to a first aspect of the present invention, there is provided an output circuit comprising operational amplifiers and a bias circuit for controlling output (e.g., bias currents) of the operational amplifiers to high and low bias modes. The bias circuit comprises: a precharge circuit including at least one precharging capacitor and switching elements for performing charging control over the precharging capacitor at a leading edge of a timing signal and performing discharging control over the precharging capacitor at a trailing edge of the timing signal; and a precharge power supply for supplying precharge voltage to the precharge circuit. The bias circuit performs a control at a high bias mode at the leading edge of the timing signal, and changes-over the control from the control at the high bias mode to a control at a low bias mode by discharging control at the trailing edge of the timing signal. (Aspect 1)

(2) In the output circuit according to aspect 1, the precharge power supply is voltage adjustable.

(3) In the output circuit according to aspect 1, the bias circuit further includes a pulse width adjusting circuit for allowing adjustment of the pulse width of the timing signal.

(4) In the output circuit according to aspect 1, the bias circuit further includes variable resistance on discharge paths caused by the discharging control by the precharge circuit.

(5) In the output circuit according to any one of aspects 1 to 4, the bias circuit outputs to the operational amplifiers an N bias voltage through an N-bias line and a P bias voltage through a P-bias line.

(6) In the output circuit according to aspect 5, the precharge power supply outputs a first precharge voltage and a second precharge voltage. The precharging capacitors comprise a first precharging capacitor connected between the N-bias line and a low-voltage side terminal VSS and a second precharging capacitor connected between a high-voltage side terminal VDD and the P-bias line. The switching elements comprise an N-channel MOS transistor connected between the first precharge voltage output terminal of the precharge power supply and the N-bias line and a P-channel MOS transistor connected between the P-bias line and the second precharge voltage output terminal of the precharge power supply.

(7) In the output circuit according to aspect 5 or 6, the operational amplifiers comprise at least one push output type operational amplifier connected to the N-bias line and at least one pull output type operational amplifier connected to the P-bias line.

(8) In the output circuit according to aspect 5 or 6 the operational amplifiers comprise at least one push-pull output type operational amplifier connected to the N-bias line and the P-bias line.

(9) In the output circuit according to any one of aspects 1 to 8, the output circuit constitutes an output circuit for the data side driving circuit of a display device.

(10) In the output circuit according to aspect 9, the display device comprises a liquid crystal display device.

According to the features described above, in the bias current control at the time of the high slew rates of the operational amplifiers, transition of the high biases to the low biases is not performed on the step basis but can be made according to smooth output curves determined by the CR time constants of the discharge paths of the precharging capacitors.

According to the present invention, during the bias current control at the time of rise and fall of the output signals of the operational amplifiers, at the time of transition from the high biases to the low biases, the smooth output curves can be obtained. Electric current consumption of the operational amplifiers is thereby reduced and distortion of the output waveforms of the operational amplifiers can be reduced.

BRIEF DESCRIPTION OF THE DRAWINGS

FIG. 12 is a circuit diagram of a conventional bias circuit 20 used as a bias circuit 10 for the output circuit 101 in FIG. 7 and the output circuit 102 in FIG. 10.

DESCRIPTION OF REFERENCE NUMERALS

| | |
|---|---|
| 1 | push output type operational amplifier |
| 2 | pull output type operational amplifier |
| 5 | push-pull output type operational amplifier |
| 11 | N-bias line |
| 12 | P-bias line |
| 22 | bias voltage extracting circuit |
| 30, 40, 50 | bias circuit |
| 31 | bias current source |
| 34, 54 | precharge circuit |
| 35, 45 | precharge power supply |
| 46 | pulse width adjusting circuit |
| 101, 102 | output circuit |
| Cn, Cp | precharging capacitor |
| Rn, Rp | variable resistance |

PREFERRED EMBODIMENTS OF THE INVENTION

When the bias currents of operational amplifiers are controlled by a bias circuit in an output circuit of the present invention, the control at the high bias or biases at the time of rise and fall of the output signals of the operational amplifiers is performed by precharging. The falling time from the high bias or biases to the low biases is determined by the discharge time of the precharging capacitors. This discharge time can also be adjusted by making a precharging time variable. This discharge time can also be adjusted by providing variable resistance for any of the discharge paths.

[First Embodiment]

Figure 1:
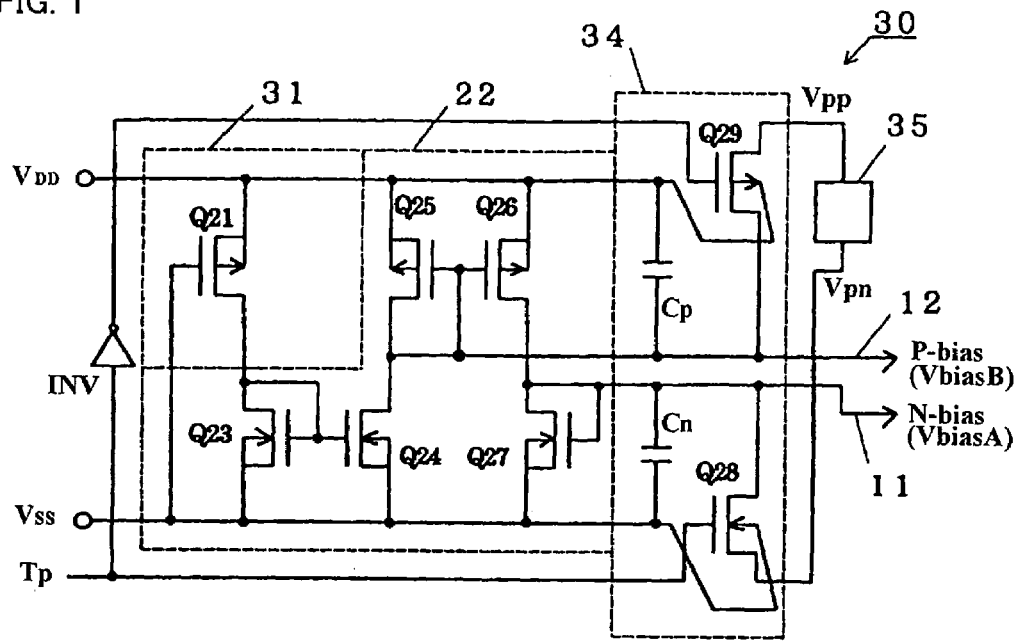
FIG. 1 is a circuit diagram of a bias circuit 30 according to a first embodiment of the present invention.
Figure 7:
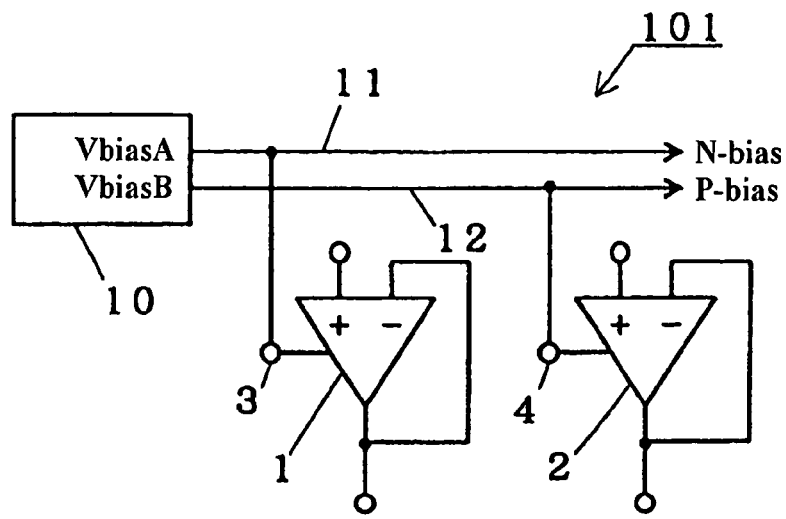
FIG. 7 is a block diagram showing a configuration of an output circuit 101 of a two-amplifier system.
Figure 8:
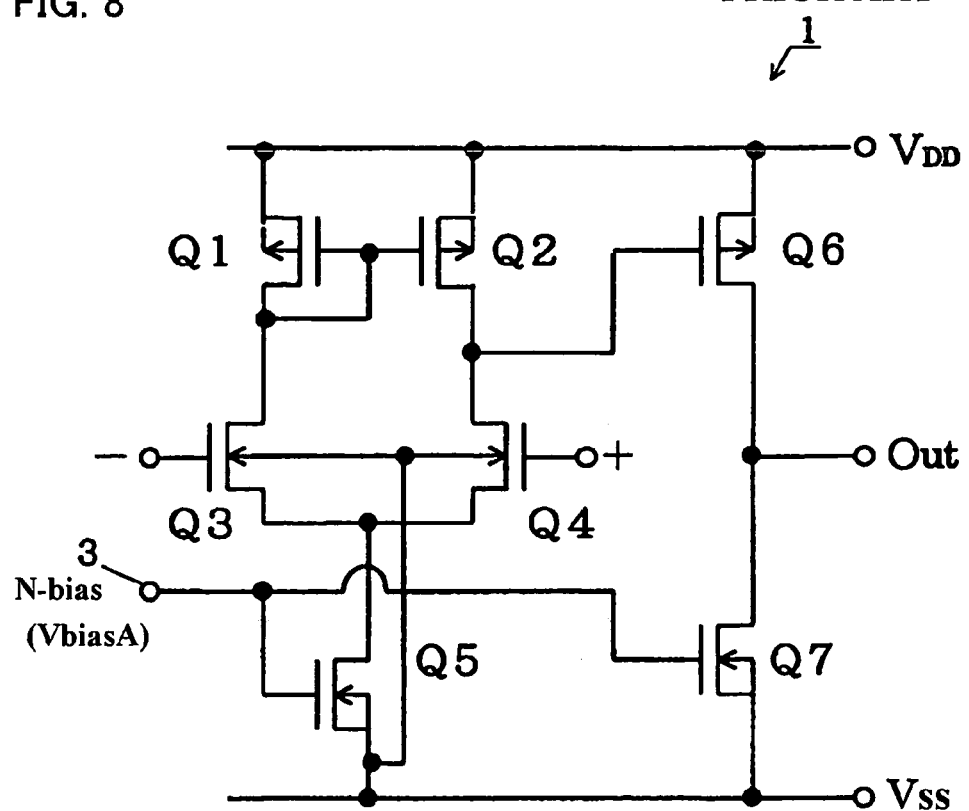
FIG. 8 is a circuit diagram showing an example of a push output type operational amplifier 1 used in the output circuit 101 in FIG. 7.
Figure 9:
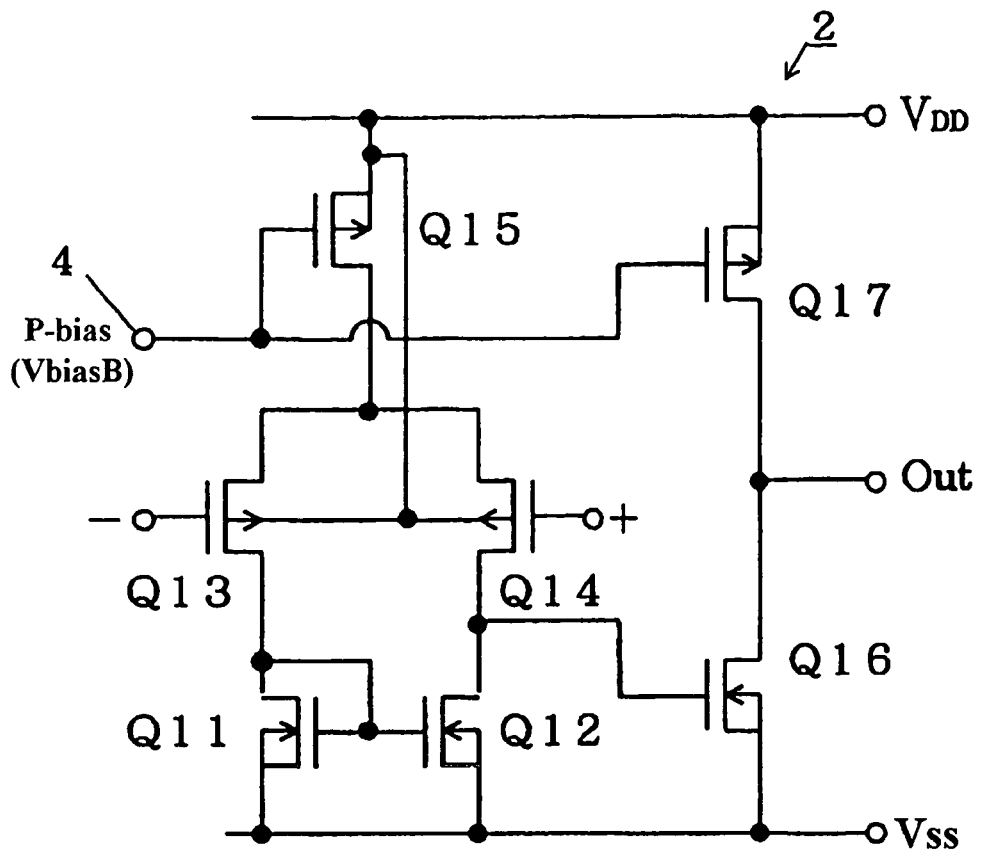
FIG. 9 is a circuit diagram showing an example of a pull output type operational amplifier 2 used in the output circuit 101 in FIG. 7.
Figure 10:
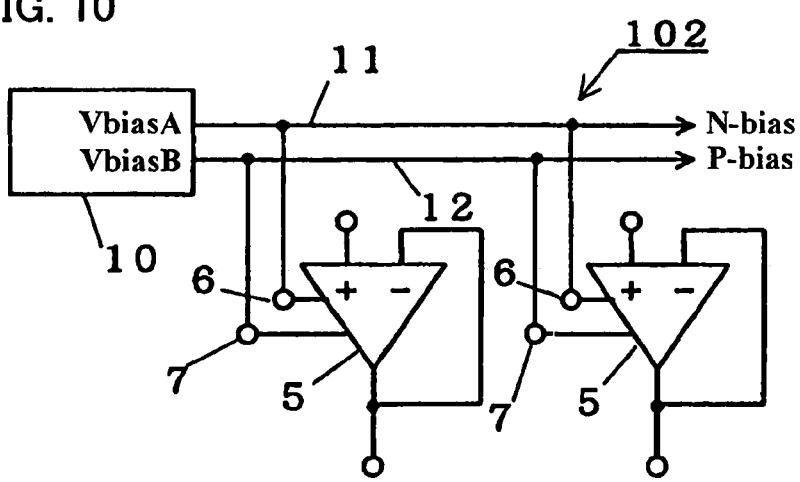
FIG. 10 is a block diagram showing a configuration of an output circuit 102 of a one-amplifier system.
Figure 11:
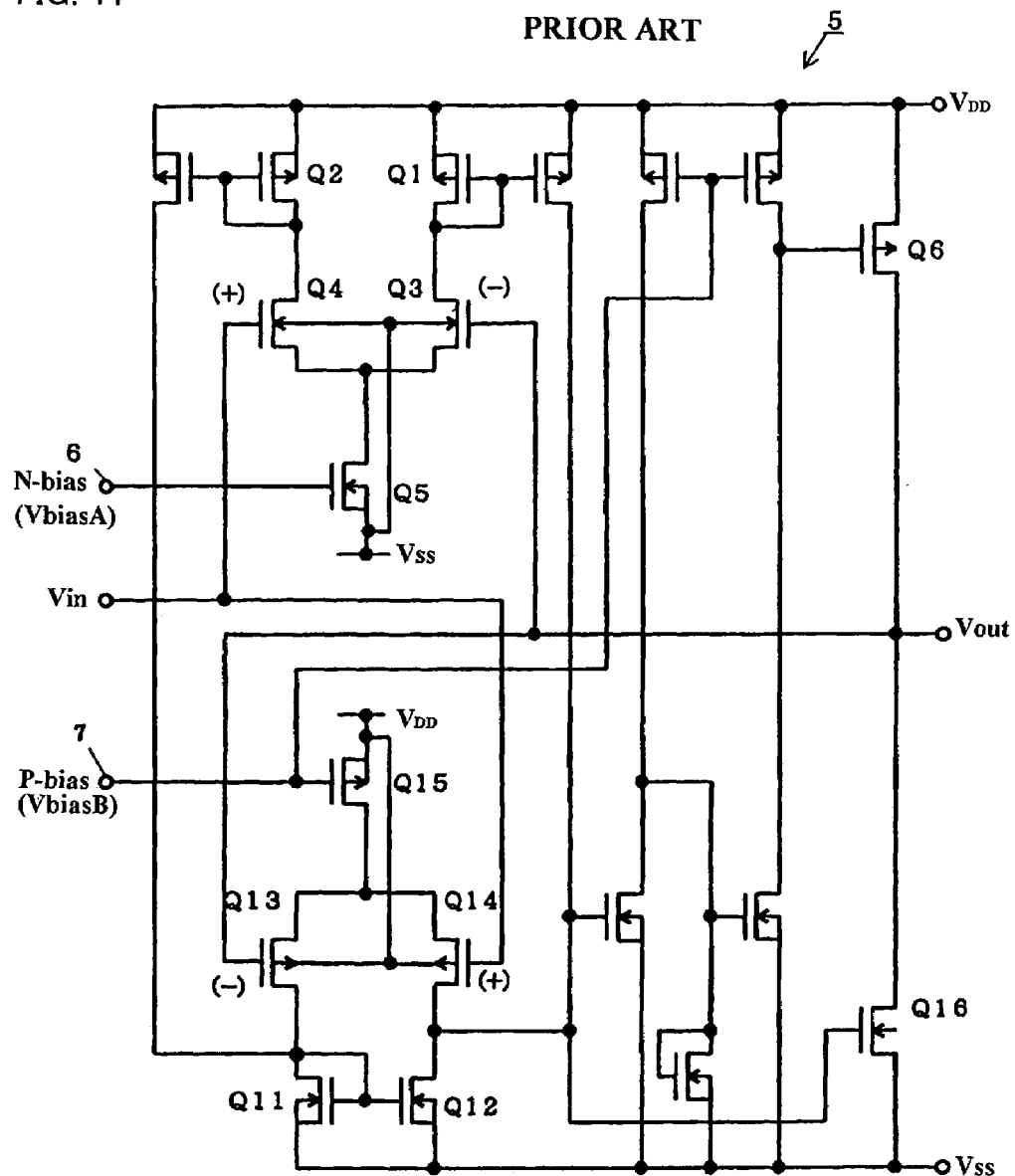
FIG. 11 is a circuit diagram showing an example of a push-pull output type operational amplifier 5 used in the output circuit 102 in FIG. 10.

A bias circuit 30 according to a first embodiment to be used as a bias circuit 10 for output circuits 101 and 102 shown in FIGS. 7 and 10 will be described below with reference to FIG. 1, as an embodiment of an output circuit of the present invention. Incidentally, by assigning same reference characters to components having basic configurations that are the same as those shown in FIG. 12, their descriptions will be omitted. Its difference from a conventional bias circuit 20 shown in FIG. 12 is the presence of a bias current source 31 in place of a bias current source 21, and addition of a precharge circuit 34 and a precharge power supply 35. The bias current source 31 is different from the bias current source 21 in that an MOS transistor Q22 and an inverter 23 are eliminated therefrom and the bias current source 31 is made up of a MOS transistor Q21 so as to eliminate switching between high and low biases and make the bias current source 31 a bias current source for the low biases. An ON-resistance R1 of the MOS transistor Q21 is set to a condition that operational amplifiers can be controlled to be biased at the low biases.

The precharge circuit 34 includes a precharging capacitor Cn connected between a low-voltage side terminal VSS and the series connection node between an MOS transistor Q26 and an MOS transistor Q27, a precharging capacitor Cp between a high-voltage side terminal VDD and the series connection node between an MOS transistor Q24 and an MOS transistor Q25 across VDD and VSS, an N-channel MOS transistor Q28 for supplying a precharge voltage Vpn to the capacitor Cn from the precharge power supply 35, and a P-channel MOS transistor Q29 for supplying a precharge voltage Vpp to the capacitor Cp from the precharge power supply 35. The MOS transistor Q28 is controlled by a timing signal Tp, and the MOS transistor Q29 is controlled by an inverted signal of the timing signal Tp inverted through an inverter INV.

The precharge power supply 35 can adjust the precharge voltages Vpn and Vpp to desired voltages, for output, in response to a control signal (not shown).

Figure 2:
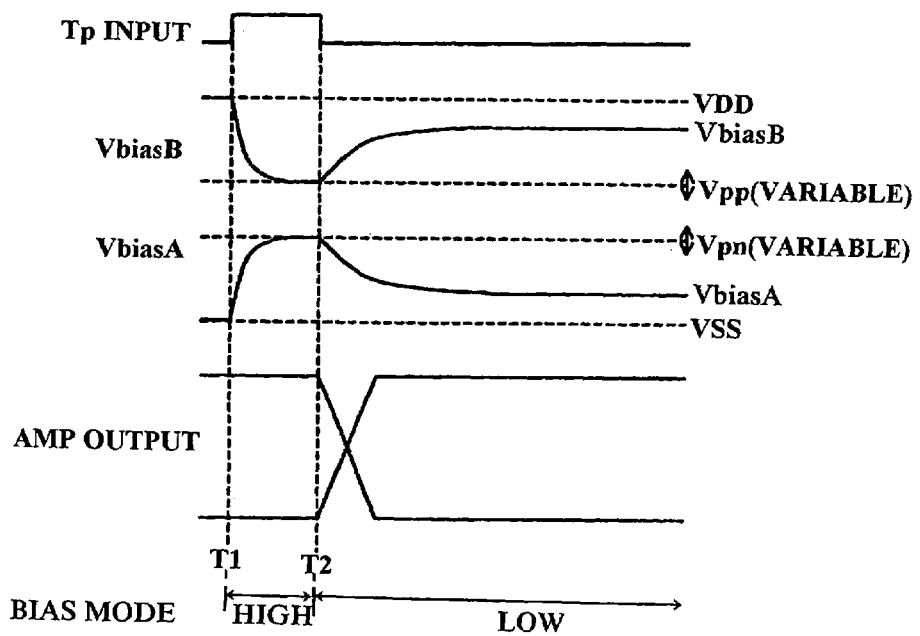
FIG. 2 is a voltage waveform diagram showing an operation of the bias circuit 30 illustrated in FIG. 1.

Next, an operation of the bias circuit 30 described above will be explained in conjunction with FIG. 2. First, the operation when the precharge circuit 34 is not operated so as to control the operational amplifiers to be biased at the low biases, or the operation using the bias current source 31 and a bias voltage extracting circuit 22 will be described. The MOS transistor Q21 of the bias current source 31 is turned ON, and a current corresponding to the ON-resistance R1 of the MOS transistor Q21 is supplied to the bias voltage extracting circuit 22. From the bias voltage extracting circuit 22, a bias voltage VbiasA and a bias voltage VbiasB, which are voltages by which the operational amplifiers can be controlled to be biased at the low biases, are supplied to an N-bias line 11 and a P-bias line 12, respectively. The operational amplifiers connected to the N-bias line 11 and the P-bias line 12 are thereby set to be biased at the low biases.

Next, an operation for controlling the operational amplifiers to be biased at the high biases will be described. When the pulse waveform of the timing signal Tp rises at a time T1, the MOS transistors Q28 and Q29 of the precharge circuit 34 are turned ON. As a result, the precharge voltages Vpn and Vpp, which are at desired levels adjusted to enable controlling the operational amplifiers to be biased at the high biases, are supplied from the precharge power supply 35 to the N-bias line 11 and the P-bias line 12, respectively. Then, the capacitor Cn of the precharge circuit 34 is charged through a potential difference of Vpn–VSS, and the capacitor Cp is charged through a potential difference of VDD–Vpp. Note the term "charge" is used common for positive and negative charging. At a time T2 when rise and fall of the output waveforms of the operational amplifiers are started in synchronization with the fall of the pulse waveform of the timing signal Tp, the potential of the N-bias line 11 reaches a voltage level substantially close to the precharge voltage Vpn and the potential of the P-bias line 12 reaches a voltage level substantially close to the precharge voltage Vpp. The operational amplifiers connected to the N-bias line 11 and the P-bias line 12 are set to be biased at a high bias mode.

When the pulse waveform of the timing signal Tp falls at the time T2, the MOS transistors Q28 and Q29 are turned OFF. As a result, the charged capacitor Cn starts discharging through the MOS transistor Q27, and the charged capacitor Cp starts charging through the MOS transistor Q25. Then, according to a CR time constant curve for each discharge path of the capacitors Cn and Cp, the potential of the N-bias line 11 and the potential of the P-bias line 12 transition to the bias voltages VbiasA and VbiasB at the time of the above-mentioned control at the low bias mode, respectively. The biases of the operational amplifiers connected to the N-bias line 11 and the P-bias line 12 therefore transition to assume a low bias mode. During the transition period from this time T2, the rise and the fall of the waveforms of the outputs of the operational amplifiers proceed. Since the precharge voltages Vpn and Vpp from the precharge power supply 35 can be adjusted, this transition period can also be set according to the precharge voltages Vpn and Vpp. If the precharge voltages Vpn and Vpp are set to be higher, the transition period can be set to be longer. If the precharge voltages Vpn and Vpp are set to be lower, the transition period can be set to be shorter.

As described above, at the time T1 when the pulse waveform of the timing signal Tp rises, charging of the capacitors Cn and Cp is started by the precharge power supply 35, so that high bias mode voltages are output from the bias circuit 30. Then, at the time T2 when the pulse waveform of the timing signal Tp falls, discharging of the capacitors Cn and Cp is started. The rise and fall transitions of the output waveforms of the operational amplifiers are started at this time T2, and are performed abruptly at a controlled slew rate due to the high bias mode. Since the bias voltages from the high bias circuit 30 transition from high bias mode to low bias mode according to the CR time constant curves for the discharge paths of the capacitors Cn and Cp, the slew rate varies from high to low as the rising and falling of the output waveforms become closer to predetermined output voltage. Thus, distortion of the output waveforms can be reduced. Further, the bias voltages at the time of the rise and the fall of the output waveforms of the operational amplifiers are attenuated according to the CR time constant curves for the discharge paths of the capacitors Cn and Cp. Thus, compared with the conventional output circuit generally set to be biased at the same high levels for a certain period of time, electric current consumption of the operational amplifiers can be reduced. Further, since the precharge voltages Vpn and Vpp from the precharge power supply 35 are made adjustable, the bias current control at the time of the rise and the fall of the output waveforms of the operational amplifiers can be turned finely.

[Second Embodiment]

Figure 3:
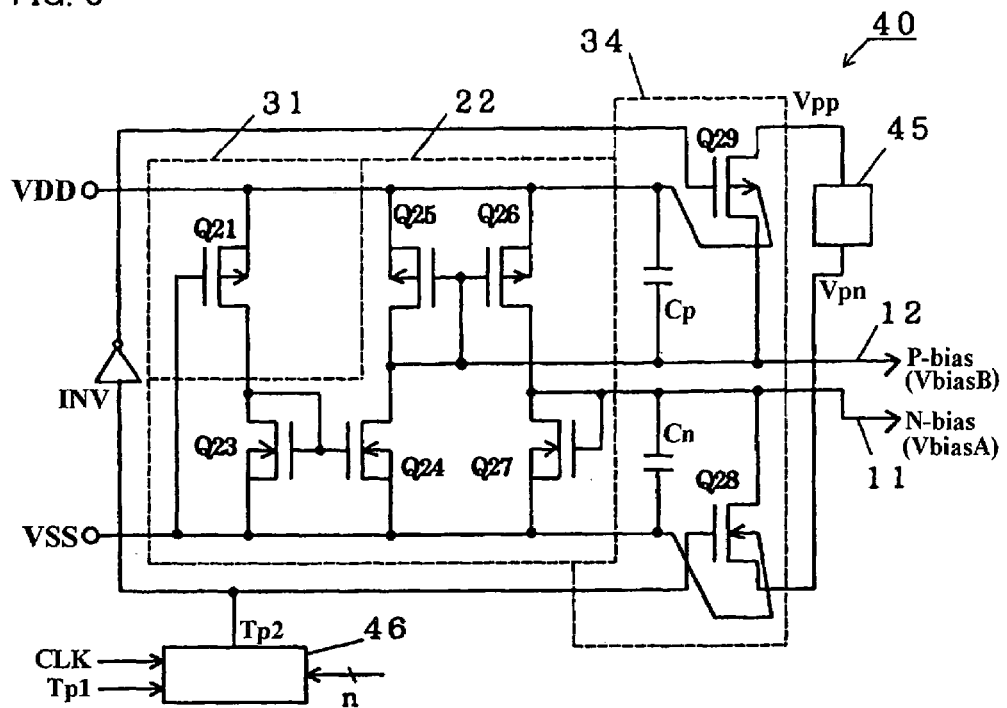
FIG. 3 is a circuit diagram of a bias circuit 40 according to a second embodiment of the present invention.

Next, a bias circuit 40 according to a second embodiment will be described with reference to FIG. 3. In FIG. 3, by assigning same reference characters to components that have same basic configurations as those shown in FIG. 1, their descriptions will be omitted. Its difference from the bias circuit 30 shown in FIG. 1 is the presence of a precharge power supply 45 in place of the precharge power supply 35 and addition of a pulse width adjusting circuit 46. Further, the precharge power supply 45 is different from the precharge power supply 35 in that the precharge power supply 45 is configured to output the precharge voltages Vpn and Vpp of predetermined constant voltages.

In the pulse width adjusting circuit 46, a desired n-bit count value is set. By counting its count value from rise of a timing signal Tp1 by a clock signal CLK, the pulse width adjusting circuit 46 outputs a timing signal Tp2 of a predetermined pulse width.

Figure 4:
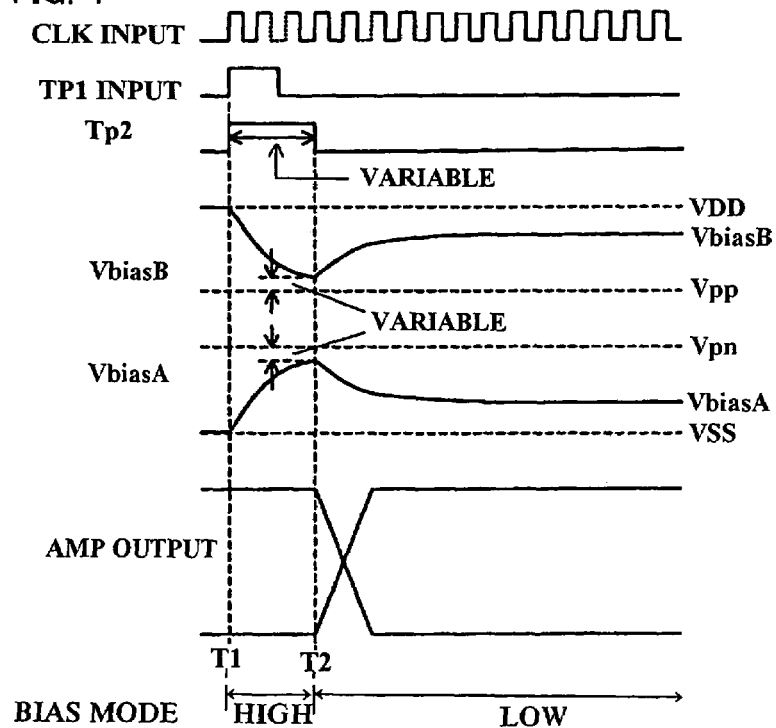
FIG. 4 is a voltage waveform diagram showing an operation of the bias circuit 40 illustrated in FIG. 3.

Next, an operation of the above-mentioned bias circuit 40 will be described in conjunction with FIG. 4. Since the operation of controlling the operational amplifiers to be biased at the low bias mode is the same as that in the first embodiment, its description will be omitted. The operation of controlling the operational amplifiers to be biased at the high bias mode will be described. At the time T1, the timing signal Tp1 that has risen is supplied to the pulse width adjusting circuit 46 in which the desired n-bit count value is set, and the timing signal Tp2 the pulse width of which has been adjusted to a desired pulse width is output from the pulse width adjusting circuit 46. When the pulse waveform of the timing signal Tp2 rises at the time T1, the MOS transistors Q28 and Q29 of the precharge circuit 34 are turned ON. As a result, from the precharge power supply 45, the precharge voltage Vpn at a predetermined level is supplied to the N-bias line 11 and the precharge voltage Vpp at a predetermined level is supplied to the P-bias line 12. Thus, the capacitor Cn of the precharge circuit 34 is charged through the potential difference Vpn–VSS, and the capacitor Cp is discharged through the potential difference VDD–Vpp. The capacitor Cn is charged according to a CR time constant curve determined together with an ON-resistance of the MOS transistor Q28, and the capacitor Cp is charged according to a CR time constant curve determined together with an ON-resistance of the MOS transistor Q29. When the pulse width of the timing signal Tp2 is set to be long until charging of the capacitors Cn and Cp has been saturated, the potential of the N-bias line 11 approaches the voltage substantially close to the precharge voltage Vpn and the potential of the P-bias line 12 approaches the voltage substantially close to the precharge voltage Vpp at the time T2 when rise and fall of the output waveforms of the operational amplifiers are started in synchronization with fall of the pulse waveform of the timing signal Tp2. The operational amplifiers connected to the N-bias line 11 and the P-bias line 12 are set to be biased at the high bias mode due to these voltages. Further, when the pulse width of the timing signal Tp2 is set within the range of the charging time until charging of the capacitors Cn and Cp has been saturated, the potential of the N-bias line 11 becomes a voltage lower than the precharge voltage Vpn by a desired value and the potential of the P-bias line 12 becomes a voltage higher than the precharge voltage Vpp by a desired value at the time T2 when the rise and the fall of the output waveforms of the operating amplifiers are started in synchronization with the fall of the pulse waveform of the timing signal Tp2. Thus, the operational amplifiers connected to the N-bias line 11 and the P-bias line 12 are set to be biased at the high bias mode.

When the pulse waveform of the timing signal Tp2 falls at the time T2, the MOS transistors Q28 and Q29 are turned OFF. As a result, the charged capacitor Cn starts discharging through the MOS transistor Q27, and the charged capacitor Cp starts discharging through the MOS transistor Q25. The potentials of the N-bias line 11 and the P-bias line 12 then transition to the bias voltages VbiasA and VbiasB at the time of the control at the low bias mode described above, respectively, according to the CR time constant curves for the discharge paths of the capacitors Cn and Cp, so that the bias mode of the operational amplifiers connected to the N-bias line 11 and the P-bias line 12 transition to the low bias mode. Each of the output waveforms of the operational amplifiers rises or falls during the transition period from this time T2. Since the pulse width of the timing signal Tp2 from the pulse width adjusting circuit 46 can be adjusted, this transition period can also be set according to the pulse width of the timing signal Tp2. If the pulse width of the timing signal Tp2 is made wider within the range of the charging time until charging of the capacitors Cn and Cp is saturated, the transition period can be set to be longer. If the pulse width is made narrower, the transition period can be set to be shorter.

As described above, charging of the capacitors Cn and Cp is started through the precharge power supply 45 at the time T1 when the pulse waveform of the timing signal Tp2 rises, and high bias mode voltages are output from the bias circuit 40. Then, at the time T2 when the pulse waveform of the timing signal Tp2 falls, discharging of the capacitors Cn and Cp is started. The rise and the fall of the output waveforms of the operational amplifiers are started at this time T2, and the rise and the fall occur abruptly due to the high bias mode. Distortion of the output waveforms of the operational amplifiers and electric current consumption of the operational amplifiers can be reduced in the same manner as in the first embodiment. Further, since the pulse width of the timing signal Tp2 from the pulse width control circuit 46 can be adjusted, the bias current control at the time of the rise and the fall of the output waveforms of the operational amplifiers can be turned finely.

[Third Embodiment]

Figure 5:
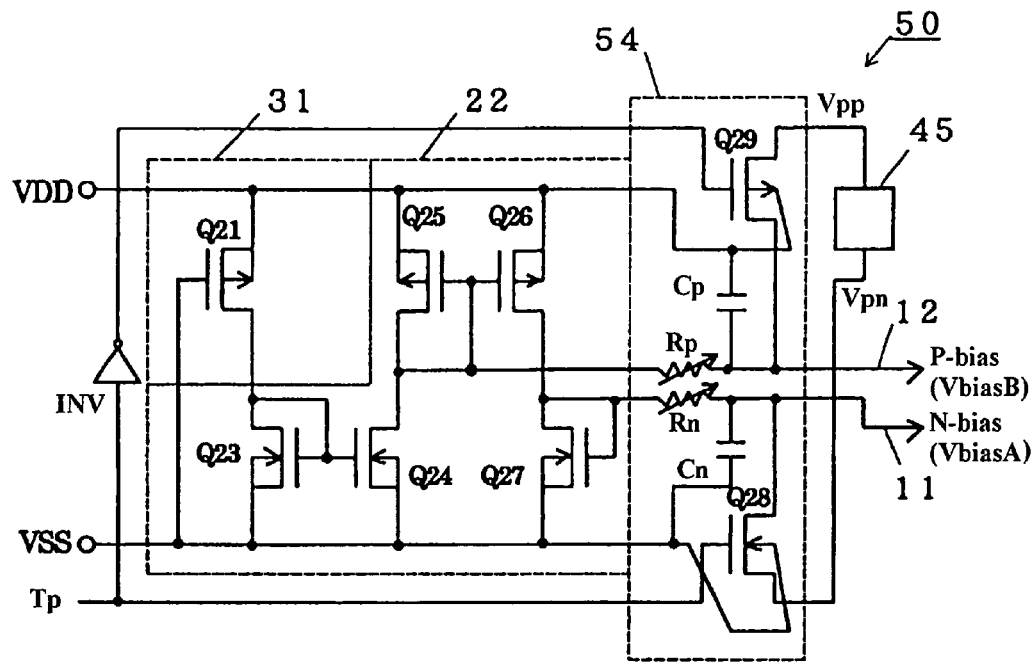
FIG. 5 is a circuit diagram of a bias circuit 50 according to a third embodiment of the present invention.

Next, a bias circuit 50 according to a third embodiment will be described with reference to FIG. 5. In this embodiment, by assigning reference numerals to the components having basic configurations that are the same as those shown in FIG. 3, their description will be omitted. Its difference from the bias circuit 40 shown in FIG. 3 is the provision of a precharge circuit 54 in place of the precharge circuit 34 and no presence of the pulse width adjusting circuit 46. The precharge circuit 54 is different from the precharge circuit 34 in that the precharging capacitor Cn is connected between the low-voltage side terminal VSS and the series connection node between the MOS transistor Q26 and the MOS transistor Q27 via a variable resistance Rn, and that the precharging capacitor Cp is connected between the high-voltage side terminal VDD and the series connection node between the MOS via Q24 and the MOS transistor A25 via a variable resistance Rp.

When the bias circuit 50 is formed on the semiconductor substrate of the semiconductor integrated circuit device, the variable resistances Rn and Rp can be configured by forming a plurality of resistance elements using diffusion resistances and enabling switching by using switching elements such as MOSFETs. Further, the variable resistances Rn and Rp can also be configured by enabling switching of a combination of ON-resistances of a plurality of MOSFETs.

Figure 6:
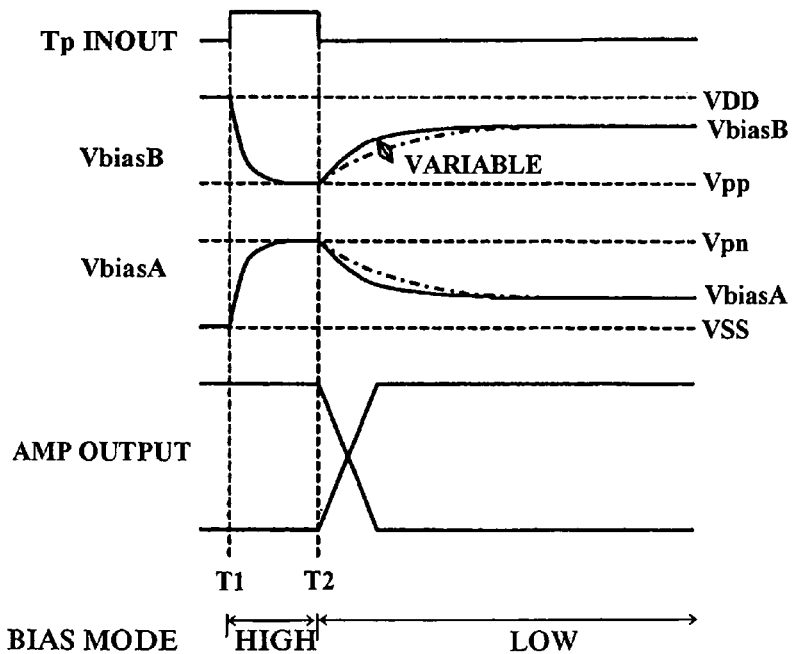
FIG. 6 is a voltage waveform diagram showing an operation of the bias circuit 50 illustrated in FIG. 5.

Next, an operation of the above-mentioned bias circuit 50 will be described in conjunction with FIG. 6. Since the operation of controlling the operational amplifiers to be biased at the low bias mode is the same as that in the first embodiment, its description will be omitted. The operation of controlling the operational amplifiers to be biased at the high bias mode will be described. When the pulse waveform of the timing signal Tp rises at the time T1, the MOS transistors Q28 and Q29 of the precharge circuit 54 are turned ON. As a result, from the precharge power supply 45, the precharge voltage Vpn at a predetermined level that can control the operational amplifiers to be biased at the high bias mode is supplied to the N-bias line 11, and the precharge voltage Vpp at a predetermined level that can control the operational amplifiers to be biased at the high bias mode is supplied to the P-bias line 12. Then, the capacitor Cn of the precharge circuit 54 is charged through the potential difference Vpn–VSS and the capacitor Cp is charged through the potential difference VDD–Vpp. At the time T2 when rise and fall of the output waveforms of the operational amplifier are started in synchronization with the fall of the pulse waveform of the timing signal Tp, the potential of the N-bias line 11 becomes a voltage level substantially close to the precharge voltage Vpn, and the potential of the P-bias line 12 becomes a voltage level substantially close to the precharge voltage Vpp. The operational amplifiers connected to the N-bias line 11 and the P-bias line 12 are therefore set to be biased at the high bias mode.

When the pulse waveform of the timing signal Tp falls at the time T2, the MOS transistors Q28 and Q29 are turned OFF. As a result, the charged capacitor Cn starts discharging through the MOS transistor Q27 and the variable resistance Rn adjusted to a desired resistance value, and the charged capacitor Cp starts discharging through the MOS transistor Q25 and the variable resistance Rp adjusted to a desired resistance value. Thus the potentials of the N-bias line 11 and the P-bias line 12 transition to the bias voltages VbiasA and VbiasB at the time of the control at the low biases described above, respectively, according to the CR time constant curve for each of the discharge paths of the capacitors Cn and Cp, so that the biases of the operational amplifiers connected to the N-bias line 11 and the P-bias line 12 transition to be low. Each of the output waveforms of the operational amplifiers rises or falls, during the transition period from this time T2. Since the resistance values of the variable resistances Rn and Rp can be adjusted, this transition period can also be set according to the resistance values of the variable resistances Rn and Rp. If the resistance values of the variable resistances Rn and Rp are increased, the CR time constants of the discharge paths are also increased, so that the transition period can be set to be longer. If the resistance values are decreased, the CR time constants of the discharge paths are also decreased, so that the transition period can be set to be shorter.

As described above, charging of the capacitors Cn and Cp is started through the precharge power supply 45 at the time T1 when the pulse waveform of the timing signal Tp rises, and high bias mode voltages are output from the bias circuit 50. Then, at the time T2 when the pulse waveform of the timing signal Tp falls, discharging of the capacitors Cn and Cp is started. The rise and the fall of the output waveforms of the operational amplifiers are started at this time T2, and the rise and the fall occur abruptly due to the high bias mode. Distortion of the output waveforms of the operational amplifiers and electric current consumption of the operational amplifiers can be reduced in the same manner as in the first embodiment. Further, since the resistances Rn and Rp of the precharge circuit 54 are made variable, the CR time constants at the time of discharging can be adjusted. The bias current control at the time of rise and fall of the output waveforms of the operational amplifiers can be thereby turned finely.

In the embodiments described above, the bias current source 31 and the bias voltage extracting circuit 22 are described as an example of the bias current source and the bias voltage extracting circuit in the bias circuit. Other circuit may also be employed within the range of the gist of the present invention. In the embodiments described above, adjustment of the transition period from the high bias mode to the low bias mode is described to be performed by examples such as the precharge power supply 35 in the first embodiment, the pulse width adjusting circuit 46 in the second embodiment, and the variable resistances Rn and Rp in the third embodiment. These may be combined, for execution. The output circuit of the data side driving circuit of the liquid crystal device is described as an example. Other dot matrix type display device, such as the output circuit of the data side driving circuit of an EL display device, may also be employed.

It should be noted that other objects, features and aspects of the present invention will become apparent in the entire disclosure and that modifications from the disclosed embodiments may be done without departing the scope of the present invention claimed as appended herewith.

Also it should be noted that any combination of the disclosed and/or claimed elements, matters and/or items may fall under the modifications aforementioned.

What is claimed is:

1. An output circuit comprising: operational amplifiers and a bias circuit for controlling output of said operational amplifiers to high and low bias modes, wherein
    said bias circuit comprises:
    a precharge circuit comprising at least one precharging capacitor and switching elements for performing charging control over said at least one precharging capacitor at a leading edge of a timing signal and performing discharging control over said at least one precharging capacitor at a trailing edge of the timing signal; and
    a precharge power supply for supplying precharge voltage to said precharge circuit;
    said bias circuit performing a control at a high bias mode at the leading edge of the timing signal, and changing-over the control from the control at the high bias mode to a control at a low bias mode by discharging control at the trailing edge of the timing signal.

2. The output circuit according to claim 1, wherein said precharge power supply is voltage adjustable.

3. The output circuit according to claim 1, wherein said bias circuit further comprises a pulse width adjusting circuit for allowing adjustment of a pulse width of the timing signal.

4. The output circuit according to claim 1, wherein said bias circuit further comprises variable resistance on discharge paths caused by the discharging control by said precharge circuit.

5. The output circuit according to claim 1, wherein said bias circuit outputs to said operational amplifiers an N bias voltage through an N-bias line and a P bias voltage through a P-bias line.

6. The output circuit according to claim 5, wherein said precharge power supply outputs a first precharge voltage and a second precharge voltage;
    said at least one precharging capacitor comprises a first precharging capacitor connected between said N-bias line and a low-voltage side terminal VSS and a second precharging capacitor connected between a high-voltage side terminal VDD and said P-bias line; and
    said switching elements comprise an N-channel MOS transistor connected between a first precharge voltage output terminal of said precharge power supply and said N-bias line and a P-channel MOS transistor connected between said P-bias line and a second precharge voltage output terminal of said precharge power supply.

7. The output circuit according to claim 5 wherein said operational amplifiers comprise at least one push output type operational amplifier connected to said N-bias line and at least one pull output type operational amplifier connected to said P-bias line.

8. The output circuit according to claim 5 wherein said operational amplifiers comprise at least one push-pull output type operational amplifier connected to said N-bias line and said P-bias line.

9. The output circuit according to claim 1, wherein said output circuit constitutes an output circuit for a data side driving circuit of a display device.

10. The output circuit according to claim 9, wherein said display device comprises a liquid crystal display device.

11. An output circuit including a bias circuit, said bias circuit comprising:
    a capacitor coupled between a first power source line and an output terminal;
    a first transistor coupled between a pre-charge power source line and said output terminal, said first transistor having a control gate supplied with a timing signal; and
    a second transistor coupled between said first power source line and said output terminal, said second transistor having a control gate coupled to said output terminal,
    wherein when said timing signal is at a first level, said first transistor is in an on-state and said capacitor is charged by a pre-charge power source on said pre-charge power source line, and
    wherein when said timing signal is at a second level, said first transistor is in an off-state and said capacitor is discharged.

12. An output circuit including a bias circuit, said bias circuit comprising:
    first and second output terminals;
    a bias voltage generator which generates first and second bias signals complementary to each other and applies said first and second bias signals to said first and second terminals, respectively;
    a pre-charge power supply which generates first and second pre-charging signals complementary to each other; and a pre-charge circuit supplying said first and second pre-charging signals to said first and second output terminals and charging first and second capacitors, respectively, during a first mode, said pre-charge circuit stopping supplying said first and second pre-charging signals to said first and second output terminals and discharging charge accumulated in said first and second capacitors to said first and second output terminals, respectively, when changing said first mode to a second mode.

13. The output circuit according to claim 11, wherein said bias circuit further comprises means for allowing adjustment of a pulse width of the timing signal.

14. The output circuit according to claim 11, wherein said bias circuit further comprises variable resistance on discharge paths caused by the discharging charge by said pre-charge circuit.

* * * * *